United States Patent
Kizilayalli et al.

[11] Patent Number: 6,103,607
[45] Date of Patent: Aug. 15, 2000

[54] MANUFACTURE OF MOSFET DEVICES

[75] Inventors: Isik C. Kizilayalli; Sailesh Mansinh Merchant; Pradip Kumar Roy, all of Orlando, Fla.

[73] Assignee: Lucent Technologies, Murray Hill, N.J.

[21] Appl. No.: 09/153,522

[22] Filed: Sep. 15, 1998

[51] Int. Cl.[7] .................. H01L 21/3205; H01L 21/4763
[52] U.S. Cl. ............................................ 438/588; 438/592
[58] Field of Search ...................................... 438/592, 588, 438/605, 614

[56]         References Cited

U.S. PATENT DOCUMENTS

| 5,049,954 | 9/1991  | Shimada et al. ........................... 357/15 |
| 5,164,333 | 11/1992 | Schwalke et al. ....................... 437/200 |
| 5,436,489 | 7/1995  | Murase ..................................... 257/401 |
| 5,648,668 | 7/1997  | Kasai ....................................... 257/280 |
| 5,872,057 | 2/1999  | Lee .......................................... 438/655 |
| 5,907,784 | 5/1999  | Larson ..................................... 438/592 |
| 5,933,741 | 8/1999  | Tseng ....................................... 438/305 |
| 5,956,585 | 9/1999  | Wen ......................................... 438/238 |

*Primary Examiner*—John F. Niebling
*Assistant Examiner*—Walter L. Lindsay, Jr.
*Attorney, Agent, or Firm*—Peter V.D. Wilde; Thomas, Kayden, Horstmeyer & Risley, LLP

[57]          ABSTRACT

The specification describes a process for making gate electrodes for silicon MOS transistor devices. The gate electrode is a composite of a first layer of tungsten suicide, a second layer of tungsten silicide nitride, and a third layer of tungsten silicide. The absence of polysilicon as a main constituent of the gate electrode eliminates depletion effects. The presence of nitride in the composite gate electrode impedes updiffusion of boron from the source and drain. The layers are preferably formed in situ in an PVD apparatus.

14 Claims, 3 Drawing Sheets ately less than 60 Angstroms. This is the dimensional regime where depletion problems occur with polysilicon gate electrodes. Next in the process sequence is the formation of the composite gate electrode 16. The gate electrode is illustrated with a single solid outline to convey the fact that in the preferred layered structure of the invention, the materials transition from one to another without a distinct break, and the entire composite gate electrode is made in essentially a single processing operation. The composite gate electrode comprises a tungsten silicide layer, $WSi_x$, 17 deposited on the gate dielectric 13, and a tungsten silicide nitride, $WSi_xN_y$, layer 18 deposited on the tungsten silicide layer 17. In forming the composite gate electrode layer, all layers are deposited in one sequential operation, as will later be described.

MANUFACTURE OF MOSFET DEVICES

FIELD OF THE INVENTION

The invention relates to methods for fabricating field effect devices and more particularly to methods for forming gate electrodes for silicon MOS transistors.

BACKGROUND OF THE INVENTION

Since the commercial inception of field effect transistors in the early 1970s, the gate electrode for these devices has been polysilicon. This choice was made both for the refractory properties of silicon, to withstand the heat required for diffusing the self-aligned source and drain in the early technology (and later to withstand the drive step for an ion implanted source and drain), and for the compatible work function between the polysilicon gates and the silicon substrate. A number of alternative materials have been tried by workers in the art but the inertia of polysilicon as the MOS gate material of choice continues in state of the art technology today. However, there are indications of problems developing with polysilicon gate electrodes due to the combination of very small dimensions, i.e. gate dielectric thickness, and low doping levels, e.g. $10^{20}/cm^3$, for the polysilicon gate electrode. These characteristics combine to introduce depletion effects in polysilicon electrodes which cause unacceptable variations in drive current due to changes in gate capacitance. Also, at these small dimensions problems with lateral diffusion of boron from the $p^+$ polysilicon to $n^+$ polysilicon becomes more severe. Boron diffuses rapidly in polysilicon which creates yield problems in CMOS devices. Thus there is a need for an improved gate electrode material in high density silicon MOS transistor technology.

STATEMENT OF THE INVENTION

We have developed an improved MOS gate structure for silicon MOS transistor IC devices. The structure is a two or three level composite of WSi and WSiN. The tungsten silicide layer provides adhesion to the gate dielectric, and the tungsten silicon nitride layer is an effective barrier to boron diffusion. This gate structure has a carrier concentration much higher than $10^{20}/cm^3$ and suffers none of the depletion problems of doped polysilicon. A useful feature of improved structure is that it can be manufactured in a single deposition tool with convenient in-situ processing of all layers of the composite.

DETAILED DESCRIPTION

Figure 1:
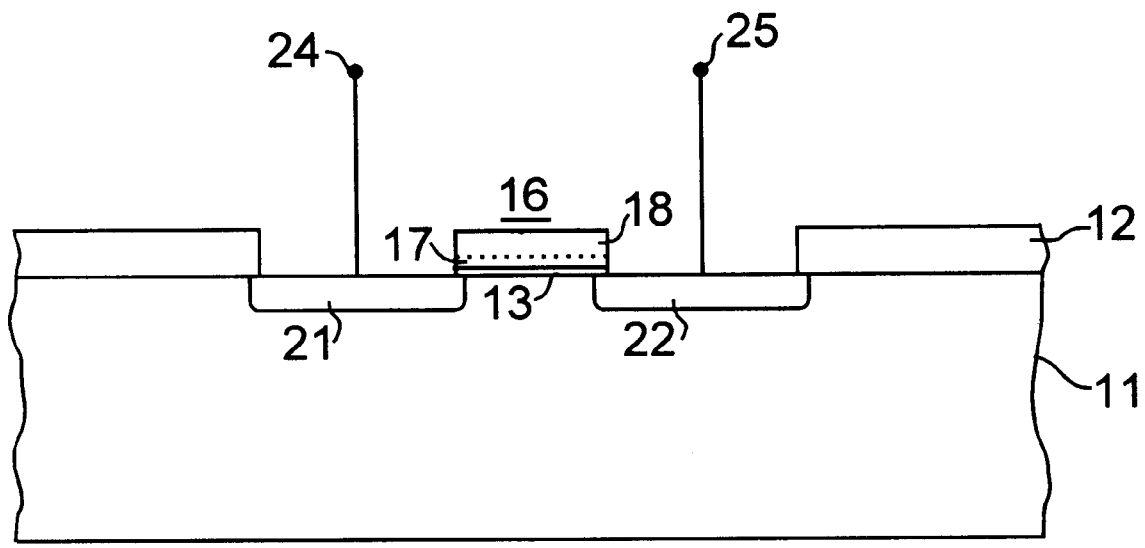
FIG. 1 is a schematic view of the gate region of a typical field effect transistor showing a composite gate electrode made according to the invention.

With reference to FIG. 1, a silicon substrate 11 is shown with field oxide 12 and gate dielectric 13 formed in the conventional manner. The composite gate electrode is shown generally at 16. In the preferred application of the invention, gate dielectric layer is less than 100 Angstroms and preferably less than 60 Angstroms. This is the dimensional regime where depletion problems occur with polysilicon gate electrodes. Next in the process sequence is the formation of the composite gate electrode 16. The gate electrode is illustrated with a single solid outline to convey the fact that in the preferred layered structure of the invention, the materials transition from one to another without a distinct break, and the entire composite gate electrode is made in essentially a single processing operation. The composite gate electrode comprises a tungsten silicide layer, $WSi_x$, 17 deposited on the gate dielectric 13, and a tungsten silicide nitride, $WSi_xN_y$, layer 18 deposited on the tungsten silicide layer 17. In forming the composite gate electrode layer, all layers are deposited in one sequential operation, as will later be described.

The composite gate electrode is then defined by, e.g., conventional RIE. The dielectric 13 is shown in FIG. 1 as etched from the source drain regions (using the composite gate electrode 16 as a mask). The source and drain 21 and 22 are then formed by conventional ion implantation. Alternatively, the dielectric layer can remain in place and the source and drain implants made through the dielectric layer using the composite gate electrode as an implant mask. For p-channel devices the dopant is boron, and for n-channel devices the dopant is typically arsenic. In some prior art processes, the gate electrode is exposed during the implant step and the impurity is implanted into the exposed gate electrode to increase gate conductivity. However, using the composite material of the invention doping of the gate is not needed, and may be avoided.

After formation of the source/drain the interlevel dielectric is deposited, second level metal is deposited and patterned, and another interlevel dielectric is deposited. Optionally a third interconnect level can be formed. The source/drain contact windows are then opened by conventional lithography, and the source and drain contact metallization is deposited and patterned to form contacts to the source and drain. The source and drain contacts are shown schematically at 24 and 25 in FIG. 1. This last series of steps is standard in IC technology and are not illustrated here.

Figure 2:
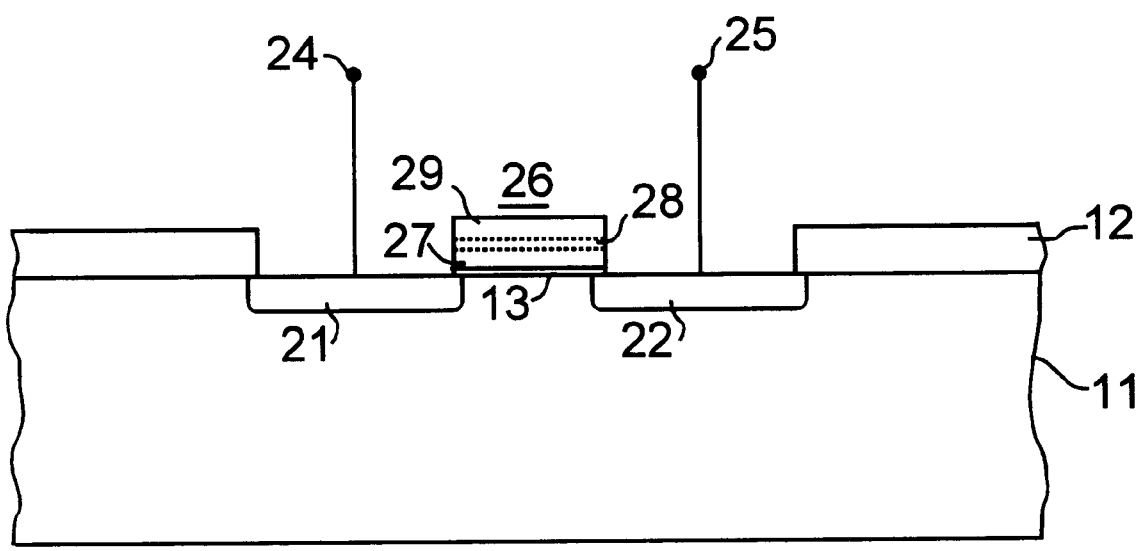
FIG. 2 is a schematic view similar to that of FIG. 1 showing an alternative composite gate electrode made according to the invention.

An alternative embodiment of a composite gate electrode according to the invention is shown in FIG. 2, where the gate electrode 26 is formed of a first layer 27 of $WSi_x$, and a second layer 28 of $WSi_xN_y$, as with the device of FIG. 1, but this gate structure has an additional layer of $WSi_x$ 29.

The important feature of the process in the context of the invention is the formation of the multilayer gate electrode. This will be described in more detail in conjunction with FIGS. 3–7.

The preferred deposition process for the layers forming the multilayer gate electrode is physical vapor deposition (PVD), i.e. sputtering. The tungsten silicide layers are sputtered from a tungsten silicide target in an inert gas atmosphere at reduced pressure. The nitride layer is formed by reactive sputtering. The multilayer depositions steps are preferably performed sequentially in the same deposition apparatus, without breaking the vacuum in the PVD apparatus. For the purpose of this description, the layers formed in this manner are defined as formed "in situ".

Figure 3:
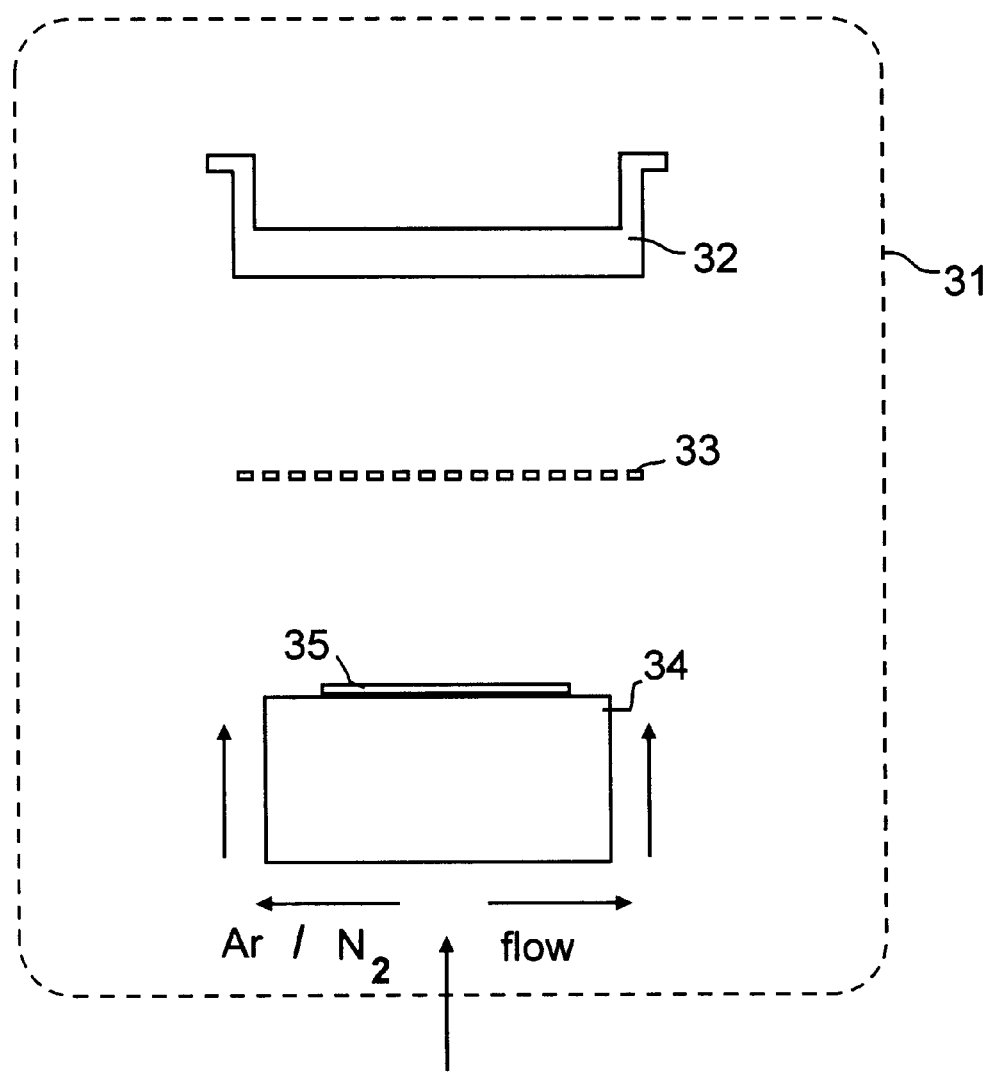
FIG. 3 is a schematic diagram of a PVD apparatus useful for implementing the invention.

The PVD process itself is conventional and may be performed in any suitable PVD apparatus. A schematic representation of a PVD apparatus is shown in FIG. 3. Vacuum chamber 31 houses the sputtering target 32, (optional) collimator 33, and the substrate heater 34, which supports the wafer 35. The gas flow is indicated in the figure and comprises argon for sputtering the metal layers, and argon plus nitrogen for reactively sputtering the nitride layer.

Figure 4:
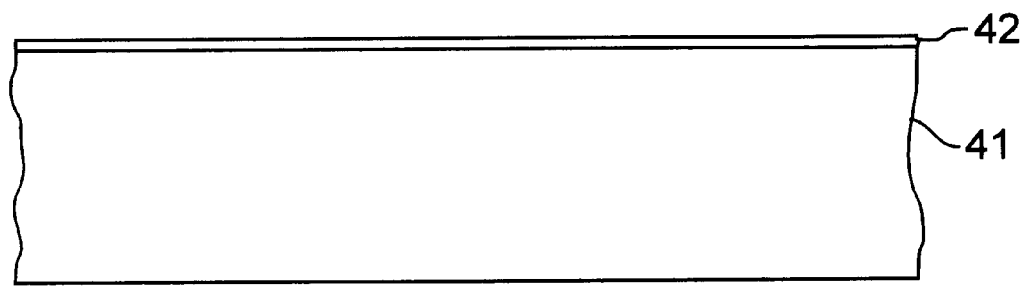
FIGS. 4–7 are schematic representations of a process sequence for forming the composite gate electrode of FIG. 1.

Referring to FIG. 4, the silicon substrate is shown at 41 with grown gate dielectric layer 42. This view is of the gate/channel region of the MOS device so the field oxide does not appear. The gate dielectric is typically $SiO_2$ but may be a composite layer of $SiO_2$ and $Si_3N_4$. The gate electrode layers are next deposited.

The process description below, in conjunction with FIGS. 4–7, is for producing the embodiment shown in FIG. 2, i.e. the three layer gate electrode. Producing the structure of FIG. 1 involves a straightforward modification of the process for the structure of FIG. 2, i.e. the first tungsten layer is omitted. Other details remain essentially the same.

Figure 5:
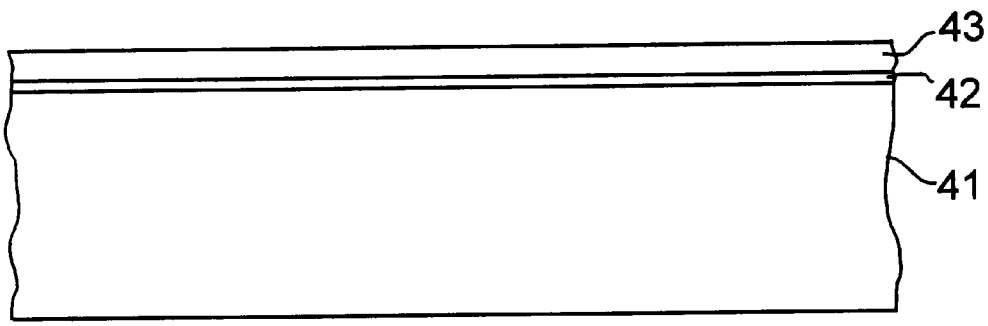

The first tungsten silicide layer, shown at 43 in FIG. 5, is deposited in the PVD reactor using a $WSi_x$ target with a Si to W ratio >2. Preferably the Si/W ratio is >2.5, and the most effective range is 2.5–2.9. This layer is optional, as mentioned above, but improves the adhesion between the gate dielectric and the $WSi_xN_y$ barrier layer to be deposited next. Layer 43 is deposited in an argon atmosphere at a pressure in the range 2–6 mTorr and a temperature in the range 100–400° C. The thickness of layer 43 is preferably in the range 100 to 400 Å.

Figure 6:
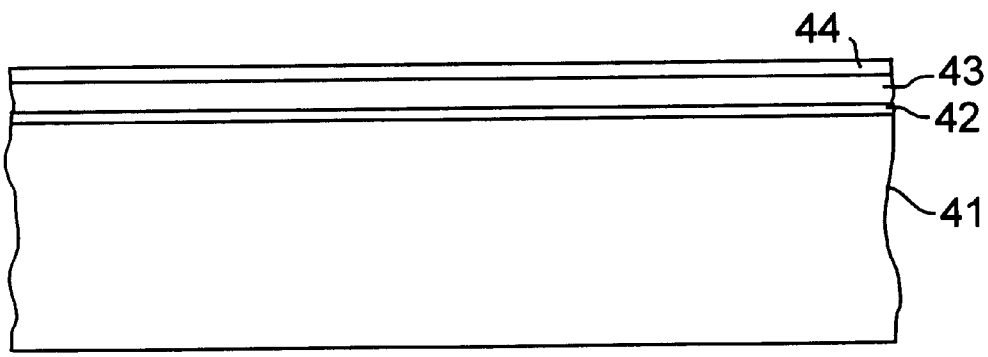

With reference to FIG. 6, the barrier layer 44 is sputter deposited on layer 43, preferably in situ in the PVD reactor by adding nitrogen to the PVD reactor. The barrier layer is $WSi_xN_y$, and is a key ingredient in the multilayer gate electrode stack for preventing boron updiffusion from the source/drain regions as outlined earlier. The preferred nitrogen flow is between 5 and 55 sccm, with the argon carrier gas flow at 40–60 sccm. The silicide/nitride material of layer 44 is typically a high resistivity material. The sheet resistance of this material can be controlled by controlling the nitrogen flow rate and the resulting composition of the layer. The preferred compositional range for the $WSi_xN_y$ barrier layer is 5 to 30% N, 40–60% Si, balance W. The preferred thickness of layer 44 is in the range 50–300 Å.

Figure 7:
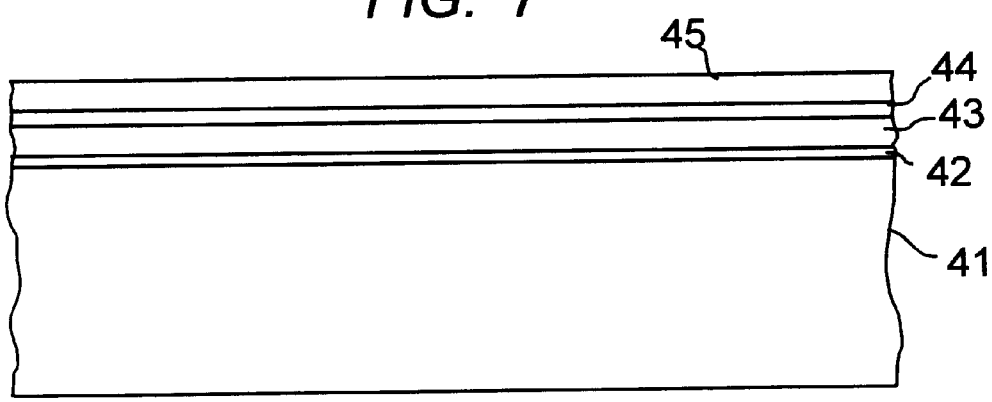

The top tungsten silicide layer, 45 in FIG. 7, is formed by turning off the nitrogen flow to the reactor and sputtering non-reactively from the tungsten silicide target in the manner used to form layer 43. The thickness of layer 45 is in the range 300–1600 Angstroms.

The nitride may be deposited in either the nitrided or the non-nitrided mode depending on the nitrogen flow rate. These deposition modes are known in the art. Layers 43–45 can also be deposited by other techniques, such as CVD. For example, the silicide can be formed using dichlorosilane, or similar precursor, and the silicide nitride layer formed by the addition of gases that provide a source of nitrogen. The deposition is then completed by shutting off the nitrogen source to form the top silicide layer.

Those skilled in the art will recognize the advantage of using the multilayer gate electrode of the invention. The multilayer structure of silicide to silicide-nitride to silicide, or silicide-nitride to silicide, constitutes a compositionally graded stack that allows stress accommodation. The ease of fabrication of such a structure is evident by the fact that the whole gate electrode stack can be deposited in one single chamber without the cost of depositing poly-Si and silicide/polycide in separate tools as in the prior art. Moreover, the $WSi_xN_y$ serves as an excellent barrier for dopant diffusion out of the junctions when the device is subject to thermal treatments while it is being fabricated. Such a barrier is not available in the poly-Si/silicide stacks used in the prior art.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. A method for the manufacture of a silicon gate field effect transistor comprising the step of:
   a. forming a dielectric layer on said silicon substrate in selected device regions, said dielectric layer having a thickness of less than 60 angstroms,
   b. depositing a multilayer gate electrode layer over said dielectric layer,
   c. etching said multilayer gate electrode layer to produce a multilayer gate electrode over a gate portion of said dielectric layer, leaving portions of said dielectric layer exposed, said portions covering source and drain regions in said substrate,
   d. implanting impurities into said source and drain regions using said multilayer gate electrode as a mask, and
   e. forming electrical contacts to said source and drain regions,
   the invention characterized in that the said multilayer gate electrode comprises a first layer of tungsten silicide, a layer of tungsten silicide nitride and a second layer of tungsten silicide.

2. The method of claim 1 wherein the multilayer gate electrode is produced by sequential steps comprising:
   i. depositing a first layer on said dielectric layer, said first layer comprising tungsten silicide
   ii. depositing a second layer on said first layer, said second layer comprising tungsten silicide nitride, and
   iii. depositing a third layer on said second layer, said third layer comprising tungsten silicide, thereby producing said multilayer gate electrode layer, and
   iv. etching said first, second and third layers to produce said multilayer gate electrode.

3. The method of claim 2 in which the source and drain regions are implanted through said exposed portions of said dielectric layer.

4. The method of claim 2 further including the step of etching away said exposed portions of said dielectric layer to expose said source and drain regions, and the impurities are implanted into said exposed source and drain regions.

5. The method of claim 2 in which the thickness of said multilayer gate electrode is in the range 500–2000 Angstroms.

6. The method of claim 2 wherein the second layer comprises 5–30% N, 40–60% Si, balance W.

7. The method of claim 3 wherein the ratio of silicon to tungsten in the tungsten silicide of the first and third layers is greater than 2.5.

8. The method of claim 4 wherein the ratio of silicon to tungsten in the tungsten silicide of the first and third layers is in the range 2.5–2.9.

9. The method of claim 2 in which the thickness of said second layer is in the range 50–300 Angstroms.

10. The method of claim 9 in which the thickness of the first layer is in the range 100–400 Angstroms.

11. The method of claim 10 in which the thickness of the third layer is in the range 300–1600 Angstroms.

12. A method for the manufacture of a silicon gate field effect transistor comprising the step of:
   a. forming a dielectric layer on said silicon substrate in selected device regions, b. depositing a multilayer gate electrode layer over said dielectric layer in said selected device regions, c. etching said gate electrode layer to produce a multilayer gate electrode over a gate portion of said dielectric layer in said device regions, leaving portions of said dielectric layer exposed, said portions covering source and drain regions in said substrate, d. implanting impurities into said source and drain regions using said multilayer gate electrode as a mask, and e. forming electrical contacts to said source and drain regions, the invention characterized in that the said multilayer gate electrode is a composite layer of a first layer comprising tungsten silicide, a second layer comprising tungsten silicide nitride, and a third layer comprising tungsten silicide, the invention further characterized in that said multilayer gate electrode is produced by sequential steps in a single apparatus comprising:

i. sputtering said first layer on said dielectric layer from a sputtering target of tungsten silicide said sputtering target having a ratio of silicon to tungsten in the range 2.5–2.9, said sputtering being conducted in a first atmosphere consisting essentially of an inert gas with a flow rate in the range 40–60 sccm, said dielectric layer having a temperature in the range 100–400° C.

ii. sputtering said second layer on said first layer from said sputtering target in a second atmosphere comprising nitrogen with a flow rate in the range 5–55 sccm, iii. sputtering said third layer on said second layer from said sputtering target in said first atmosphere, thereby producing said multilayer gate electrode layer, and iv. etching said first, second and third layers to produce said multilayer gate electrode.

13. A method for the manufacture of a silicon gate field effect transistor comprising the step of:

a. forming a dielectric layer on said silicon substrate in selected device regions, b. depositing a multilayer gate electrode layer over said dielectric layer, c. etching said multilayer gate electrode layer to produce a multilayer gate electrode over a gate portion of said dielectric layer, leaving portions of said dielectric layer exposed, said portions covering source and drain regions in said substrate, d. implanting impurities into said source and drain regions using said multilayer gate electrode as a mask, and e. forming electrical contacts to said source and drain regions, the invention characterized in that the said multilayer gate electrode is a composite layer comprising a first layer of tungsten silicide, a layer of tungsten silicide nitride and a second layer of tungsten silicide, and wherein the multilayer gate electrode is produced by sequential steps carried out by PVD comprising:

i. depositing a first layer on said dielectric layer, said first layer comprising tungsten silicide ii. depositing a second layer on said first layer, said second layer comprising tungsten silicide nitride, and iii. depositing a third layer on said second layer, said third layer comprising tungsten silicide, thereby producing said multilayer gate electrode layer, and iv. etching said first, second and third layers to produce said multilayer gate electrode.

14. The method of claim 13 in which steps i., ii., and iii. are carried out in a reduced pressure apparatus without breaking the reduced pressure in said apparatus.

* * * * *